(12) United States Patent
Muráncsik et al.

(10) Patent No.: US 11,815,678 B2
(45) Date of Patent: Nov. 14, 2023

(54) WINDSCREEN DISPLAY

(71) Applicant: DYNACLOUD KFT., Budapest (HU)

(72) Inventors: György Csaba Muráncsik, Budapest (HU); Tibor Károly Kellessy, Budapest (HU); Gábor Tarnói, Budapest (HU); József Goldfárth, Budapest (HU)

(73) Assignee: DynaCloud Kft., Budapest (HU)

( * ) Notice: Subject to any disclaimer, the term of this patent is extended or adjusted under 35 U.S.C. 154(b) by 407 days.

(21) Appl. No.: 16/961,553

(22) PCT Filed: Jan. 11, 2019

(86) PCT No.: PCT/EP2019/050639
§ 371 (c)(1),
(2) Date: Jul. 10, 2020

(87) PCT Pub. No.: WO2019/138040
PCT Pub. Date: Jul. 18, 2019

(65) Prior Publication Data
US 2021/0063738 A1  Mar. 4, 2021

(30) Foreign Application Priority Data

Jan. 11, 2018 (EP) .................................... 18462001

(51) Int. Cl.
*G02B 27/01* (2006.01)
*B60J 1/20* (2006.01)
*B60K 35/00* (2006.01)

(52) U.S. Cl.
CPC ............ *G02B 27/0101* (2013.01); *B60J 1/20* (2013.01); *B60K 35/00* (2013.01);
(Continued)

(58) Field of Classification Search
CPC ... G02B 27/01–0189; G02B 2027/0105–0198; G02B 27/00–648;
(Continued)

(56) References Cited

U.S. PATENT DOCUMENTS

2015/0077826 A1* 3/2015 Beckman ................... B60J 3/02
359/601
2017/0294610 A1* 10/2017 Sasaki ................. H01L 27/3211
(Continued)

*Primary Examiner* — Bao-Luan Q Le
*Assistant Examiner* — Christopher A Lamb, II
(74) *Attorney, Agent, or Firm* — Jason D. Voight (57) ABSTRACT

The transparent windscreen display (100) has a multilayer structure comprising at least the following layers: a transparent substrate layer (110); a transparent adhesive layer (120); a transparent display module (130); and a transparent protective layer (140). The display module (130) is configured to have a plurality of pixel units or pixel array units with an inter-pixel space therebetween. There is a predetermined distance (d) between the adjacent pixel units or pixel array units in both longitudinal and transversal directions of the display module (130), said distance being about 20-80% of the width of one pixel unit. The inter-pixel space is filled with a transparent material and involves flexible electric conductors for electrically connecting the adjacent pixel units or pixel array units. At least a part of the windscreen display (100) is bent along two directions with a minimum deflection of 10% in a first direction and a minimum deflection of 5% in a second direction perpendicular to said first direction.

7 Claims, 7 Drawing Sheets

(52) U.S. Cl.
CPC ............... *B60K 2370/1529* (2019.05); *B60K 2370/1533* (2019.05); *G02B 2027/013* (2013.01)

(58) Field of Classification Search
CPC ......... Y02P 70/00–62; Y02E 10/00–76; B60K 2370/00–98; B60K 35/00; H10K 77/111; B60J 1/20
See application file for complete search history.

(56) References Cited

U.S. PATENT DOCUMENTS

| | | | |
|---|---|---|---|
| 2018/0341110 A1* | 11/2018 | Hirata | G02B 27/286 |
| 2018/0370195 A1* | 12/2018 | Laluet | B32B 17/10541 |
| 2019/0296057 A1* | 9/2019 | Misaki | H01L 27/1255 |

* cited by examiner

PRIOR ART

WINDSCREEN DISPLAY

This is the national stage of International Application PCT/EP2019/050639, filed Jan. 11, 2019.

FIELD OF THE INVENTION

The present invention relates to windscreen displays. In particular, the present invention relates to a multilayer transparent windscreen display that comprises a transparent display module as an intermediate layer.

BACKGROUND OF THE INVENTION

Currently, road vehicles are often equipped with a head-up display to assist the driver in various driving conditions through presenting specific information relating to the vehicle or the environment of the vehicle (e.g. road signs, other vehicles or objects in the vicinity of the vehicle, etc.).

A head-up display (HUD) is a transparent graphical display that presents visual information for a user without requiring the user to look away from his or her usual viewpoint. Today, head-up displays are commonly used in vehicles, where a transparent surface is arranged in front of the driver and the information to be presented is projected to a transparent surface from a projector device through an optical system. Current HUDs can be categorized into two groups: windscreen HUDs and combiner HUDs. The windscreen HUDs use the windscreen of the vehicle as a projection surface, while the combiner HUDs use an additional transparent screen, a so called combiner screen, as the projection surface. Although combiner screen HUDs are more common in road vehicles due to their lower overall costs, they have the particular drawback of the smaller screen size of the projection surface. The smaller projection surface of the combiner screens allows the presentation of smaller text and symbol sizes or less information.

Figure 1:
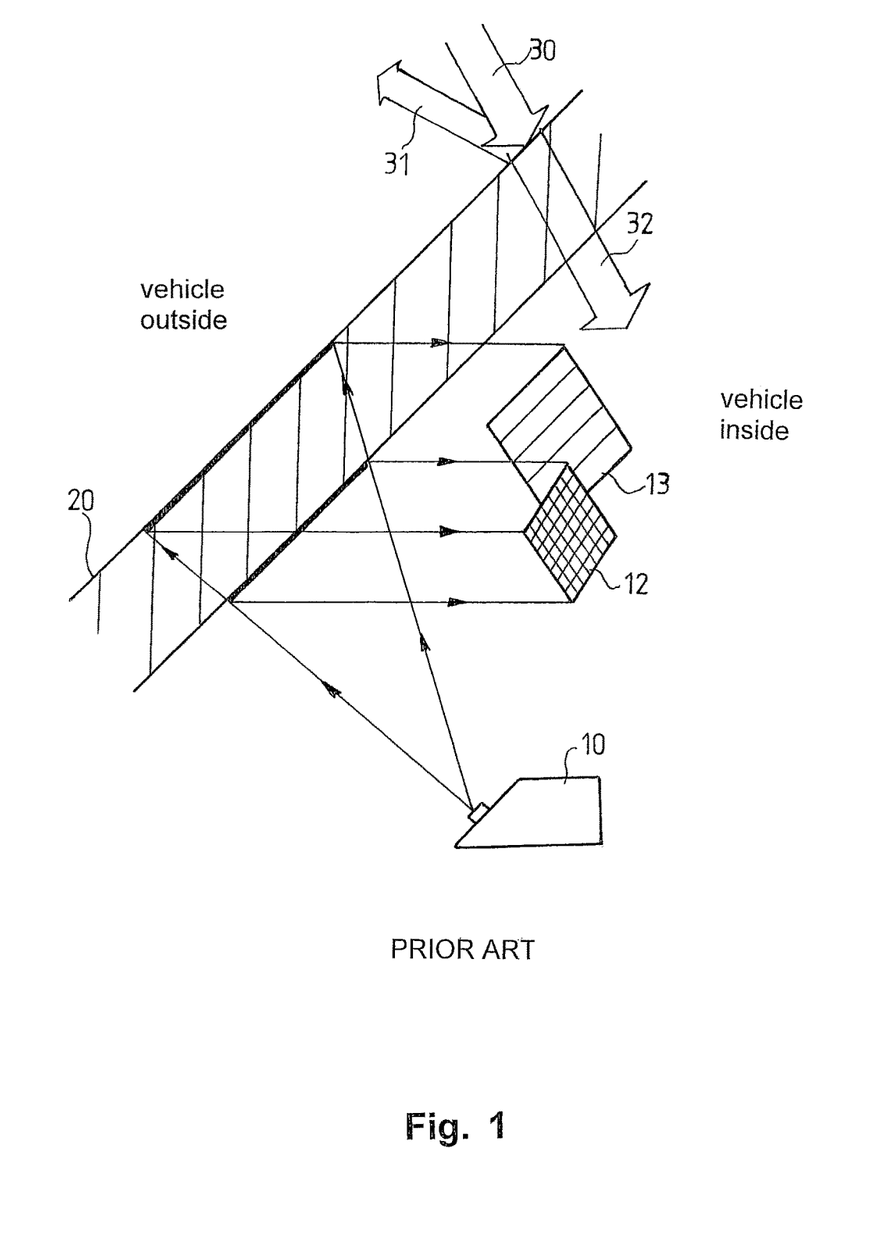
FIG. 1 schematically illustrates unfavorable optical phenomena of prior art windscreen head-up displays.

The windscreen HUDs have the drawback that they can produce a spurious image since the projected image appears on the inner side of the windscreen on the one hand, it also appears on the outer side of the windscreen at slightly offset position, on the other hand, due to the thickness of the windscreen. This phenomenon is schematically illustrated in FIG. 1. When a projector device 10 projects an image 12 to the inner surface of a windscreen 20, a major part of the emitted light is reflected from the inner surface of the windscreen 20 and thereby producing a primary (real) view 12 of the image on the windscreen. However, a minor part of the emitted light enters the windscreen and reflected from the outer surface of the windscreen 20, which results in a secondary view 13 of the projected image, called a spurious image. This spurious image may disturb and tire the driver of the vehicle.

A further drawback of the windscreen HUDs is that at daylight, in particular when the sun is directly shining onto the windscreen, the projected image is less or even not at all visible for the driver. This phenomenon is also schematically illustrated in FIG. 1. When the incident light 30 of a high-intensity external illumination source, like the sunshine, reaches the outer surface of the windscreen 20, only a minor portion of the incident light 30 reflects from that surface as a reflected light 31, while a major portion of the incident light 30 traverses through the windscreen 20, thereby making the inner side of the windscreen rather bright. Due to the excessive brightness of the windscreen, the relative intensity of the projected image significantly decreases, which may cause difficulty for the driver in observing the image. Although brightness of the windscreen may be reduced by applying a darkening film on the inner side of the windscreen, the permanent use of such a darkening film is disadvantageous (and dangerous) for driving at nightlight.

A number of documents disclose head-up display systems for vehicles. For example, the document US 2005/0154505 A1 describes a head-up display which uses the entire windshield as a display area. The head-up display system includes a video projector, a screen, a windshield and a Fresnel mirror. The Fresnel mirror magnifies an image from the screen so as to be visually recognized by a driver through his or her eyes.

The document US 2017/0212398 A1 discloses a display panel which enables the adjustment of light transmittance. The display panel includes a plurality of sub-pixel regions arranged into an array, at least some of the sub-pixel regions each comprising a display region configured for displaying an image and a light transmitting region configured for transparent display, and the light transmitting region is provided therein with a light adjusting device having an adjustable light transmittance. The display panel may be made flexible by arranging the light transmitting regions into rows, however, the display panel can be bent only in one direction even with this configuration.

In view of the above mentioned problems of the currently used HUDs and display panels, there is a need for a transparent windscreen display which allows bending the windscreen display along two orthogonal directions.

SUMMARY OF THE INVENTION

It is therefore a primary object of the present invention to provide a transparent windscreen display that can be bent along two orthogonal directions for use in a windscreen of a vehicle.

an object of the present invention to provide a transparent windscreen display that can present visual information substantially on the entire surface of the windscreen.

It is a further object of the present invention to provide a transparent windscreen display that can present the information under both daylight and nightlight conditions without adversely affecting the driving safety.

It is yet another object of the present invention to provide a transparent display that can be used as a front windscreen of vehicles.

These and other objects are achieved by providing a transparent windscreen display having a multilayer structure comprising at least the following layers: a transparent substrate layer; a transparent adhesive layer; a transparent display module; and a transparent protective layer. The display module is configured to have a plurality of pixel units or pixel array units with an inter-pixel space therebetween, wherein there is a predetermined distance between the adjacent pixel units or pixel array units in both longitudinal and transversal directions of the display module, said distance being about 20-80% of the width of one pixel unit, and wherein said inter-pixel space is filled with a transparent material and involves flexible electric conductors for electrically connecting the adjacent pixel units or pixel array units, and wherein at least a part of the windscreen display is bent along two directions with a minimum deflection of 10% in a first direction and a minimum deflection of 5% in a second direction perpendicular to said first direction, and wherein said transparent display module is formed as an LCD display panel without a backside illumination unit.

Preferably, the material of the transparent substrate layer is selected from the group of glass and transparent polymer.

Preferably, the protective layer comprises a single layer of a transparent adhesive film, said adhesive film being secured to the transparent display module.

Preferably, the protective layer comprises a transparent gluing layer and a glass layer, said glass layer being secured to the transparent display module via said gluing layer.

It is preferred that the distance between the adjacent pixel units or pixel array units is at least about 20% and at most about 80% of the width of one pixel unit.

In one embodiment the windscreen display further comprises a built-in light source arranged along the periphery of the transparent display module.

BRIEF DESCRIPTION OF THE DRAWINGS

The present invention will now be described in more detail with reference to the drawings, in which.

DETAILED DESCRIPTION OF THE PREFERRED EMBODIMENTS

The design and the production of the windscreen display according to the invention will be described in more detail with reference to FIGS. 2 to 5.

Figure 2:
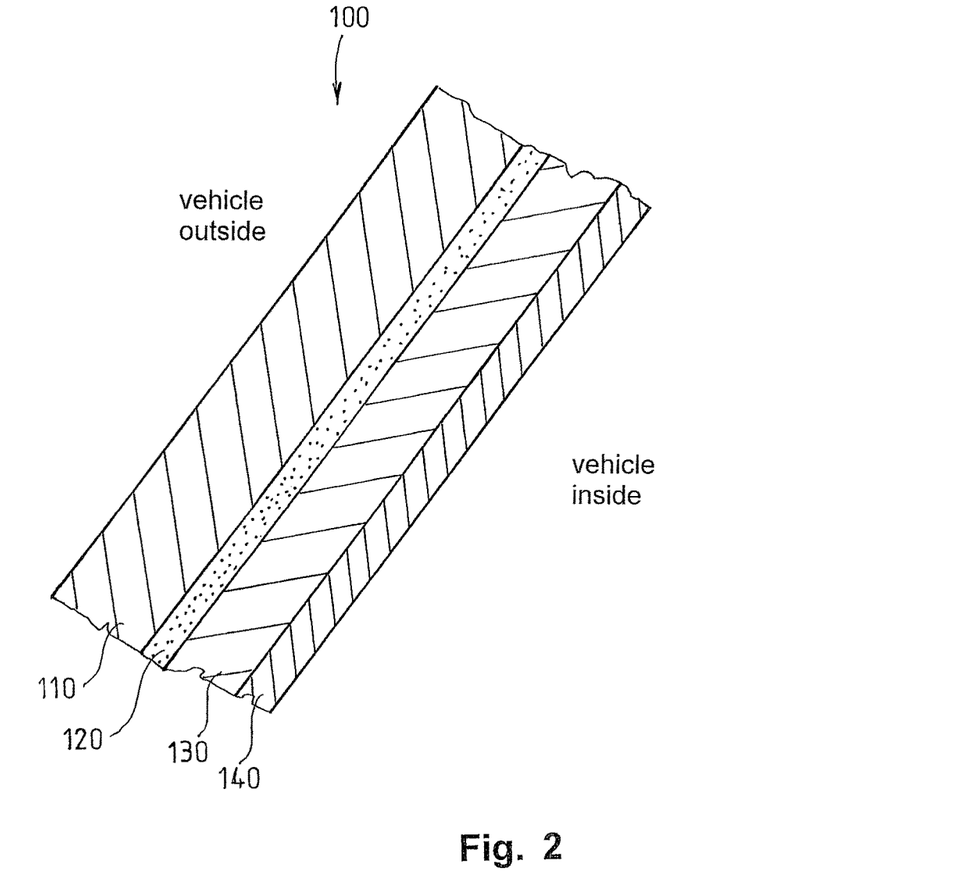
FIG. 2 schematically illustrates the layer structure of the windscreen display of the invention in a cross-sectional view.

In FIG. 2, a windscreen display 100 of the present invention is illustrated in a schematic sectional view. The windscreen display 100 has a multilayer structure comprising the layers shown in FIG. 2.

The outermost layer of the windscreen display 100 is a transparent substrate layer 110, typically made of glass or a transparent polymer. The composition of the material of the substrate layer 110 is selected from the materials commonly used in vehicle manufacturing industry. The thickness of this substrate layer 110 is substantially the same as that of the conventional windscreens, typically ranging between 8 mm and 12 mm, depending on the type of the vehicle in which the windscreen display is mounted.

The next layer is a transparent adhesive layer 120 that is used to secure a transparent display module 130 to the substrate layer 110. The materials that can be used for the adhesive layer 120 are well known for those skilled in the art of vehicle industry. The thickness of the adhesive layer 120 typically ranges from 0.1 mm to 0.8 mm.

The transparent display module 130 is produced on the basis of the manufacturing process of conventional transparent display panels, such as transparent LCD panels or transparent organic LED (OLED) display panels, but it has some significant differences from the known, commercially available transparent display panels as described below.

First of all, the pixel resolution of the transparent display module 130 is set to the order of Full HD resolution (1920×1080 pixels), meaning a linear pixel density of approximately 30-50 pixels per inch (ppi) with assuming a width of ca. 120-150 cm for the windscreen of a mid-size car. For a display module of this size, the typical pixel size is about 0.8-1.0 mm in both longitudinal and transversal directions of the display module. This reduced pixel resolution is significantly lower than that of the high-tech transparent displays that are currently merchandized. However, the size of the pixel units of the display module 130 including the color filters or LEDs of different colors (red, green, blue) are kept in the same range as in the currently available high-tech transparent displays. The reduced pixel resolution of the transparent display module 130 and the currently available small pixel sizes together result in a transparency of about 60-70% or even higher for the transparent display module 130, which is substantially higher than that of the commercially available transparent displays, which have a typical transparency of about 15-17%. The reduced number of pixels in both directions of the windscreen display 100 is achieved by arranging the pixels of the display module at a specific distance from each other. The distance between the adjacent pixels typically ranges from 0.2 mm to 0.6 mm for providing the required (increased) transparency along with keeping at least Full HD resolution for the windscreen display 100. For a display having a width of ca. 120-150 cm, the ratio of the inter-pixel distance and the applied pixel size (measured in either direction) is in the range of ca. 0.2-0.8. However, the afore-mentioned distance between the adjacent pixel units it may be even smaller or greater depending on the actual dimensions and the application field of the particular windscreen display 100. As for smaller display modules the pixel size is usually decreased, the afore-mentioned ratio of the inter-pixel distance and the applied pixel size (measured in either direction) still falls into the same range, i.e. approximately 0.2-0.8.

Figure 3:
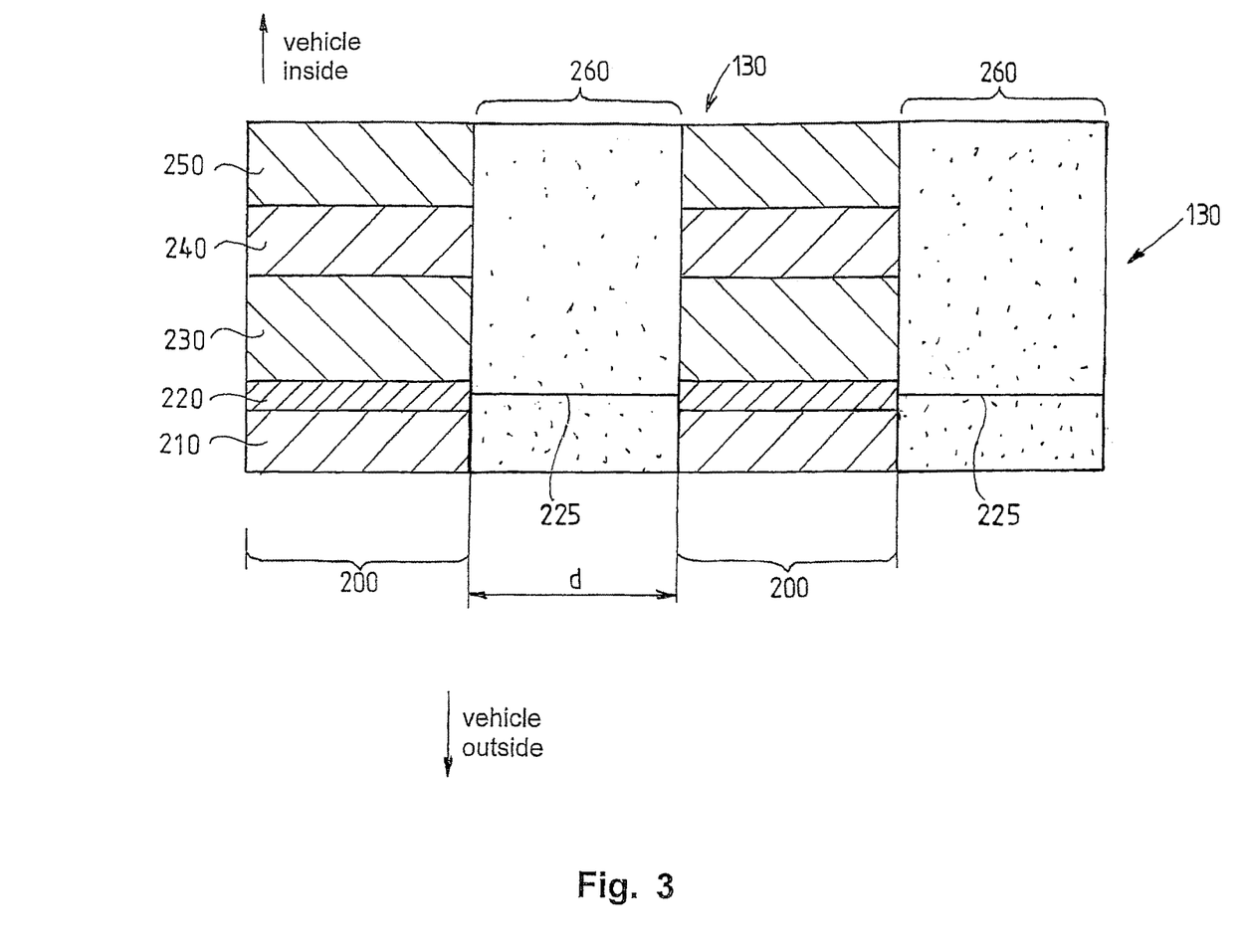
FIG. 3 illustrates, in a schematic cross-sectional view, an exemplary layer structure of the transparent display module for the windscreen display according to the present invention.

FIG. 3 illustrates, in a schematic sectional view, an exemplary layer structure of a portion of the transparent display module 130, either in the longitudinal or the transversal direction, that may be used in the windscreen display 100 according to the present invention. In this structure, which is based on a conventional transparent OLED display structure, one pixel unit 200 is formed of the following layers specified in their order from outside inwards. The first, outermost layer of the pixel unit 200 is a substrate layer 210, which is preferably made of glass. The next layer is an electronic control layer 220 which comprises the electronic components (e.g. thin film transistors and electric conductors) of the display module 130. The separate pixel units 200 are interconnected via the electric conductors of the electronic control layers 220. The electronic control layer 220 is also made of transparent materials.

The next layer of the pixel unit 200 is an organic layer 230 that comprises the conventional components for emitting light. The organic layer 230 may include an anode layer, a conductive layer, an emissive layer and a cathode layer. The conductive layer and the emissive layer together form an organic light emitting layer entirely made of transparent organic materials, like organic molecules or organic polymers.

The organic layer 230 is covered by a transparent covering layer 240, preferably made of glass. The innermost layer of the pixel unit 200 is a transparent polarizing layer 250.

The space between the separate pixel units 200, the so called inter-pixel space, is filled with a transparent filling material. The inter-pixel space 260 also includes the transparent signal lines 225 of the electronic layers 220 for establishing electrical interconnections between the electronic control layers 220 of the adjacent pixel units 200. Preferably, the inter-pixel space 260 is filled with a transparent coloring material for providing, for example, color balance between the pixel units 200 and the inter-pixel space 260 so that the whole transparent display module 130 has a uniform color shade over its entire surface. The transparent filling material of the inter-pixel space 260 also functions to provide the display module 130 with a continuous and smooth outer surface on both faces thereof. Preferably, the optical properties of the filling materials used in the inter-pixel space 260 also match the optical properties of the pixel units 200. Additionally, the transparent filling material of the inter-pixel space 260 is also flexible.

The distance d between two adjacent pixel units 200 amounts to about 20-80% of the width of the pixel units 200 in both longitudinal and transversal directions of the display module 130, which allows bending the display module 130 in both directions at the same time without damaging the relatively rigid structures of the pixel units 200.

Figure 4:
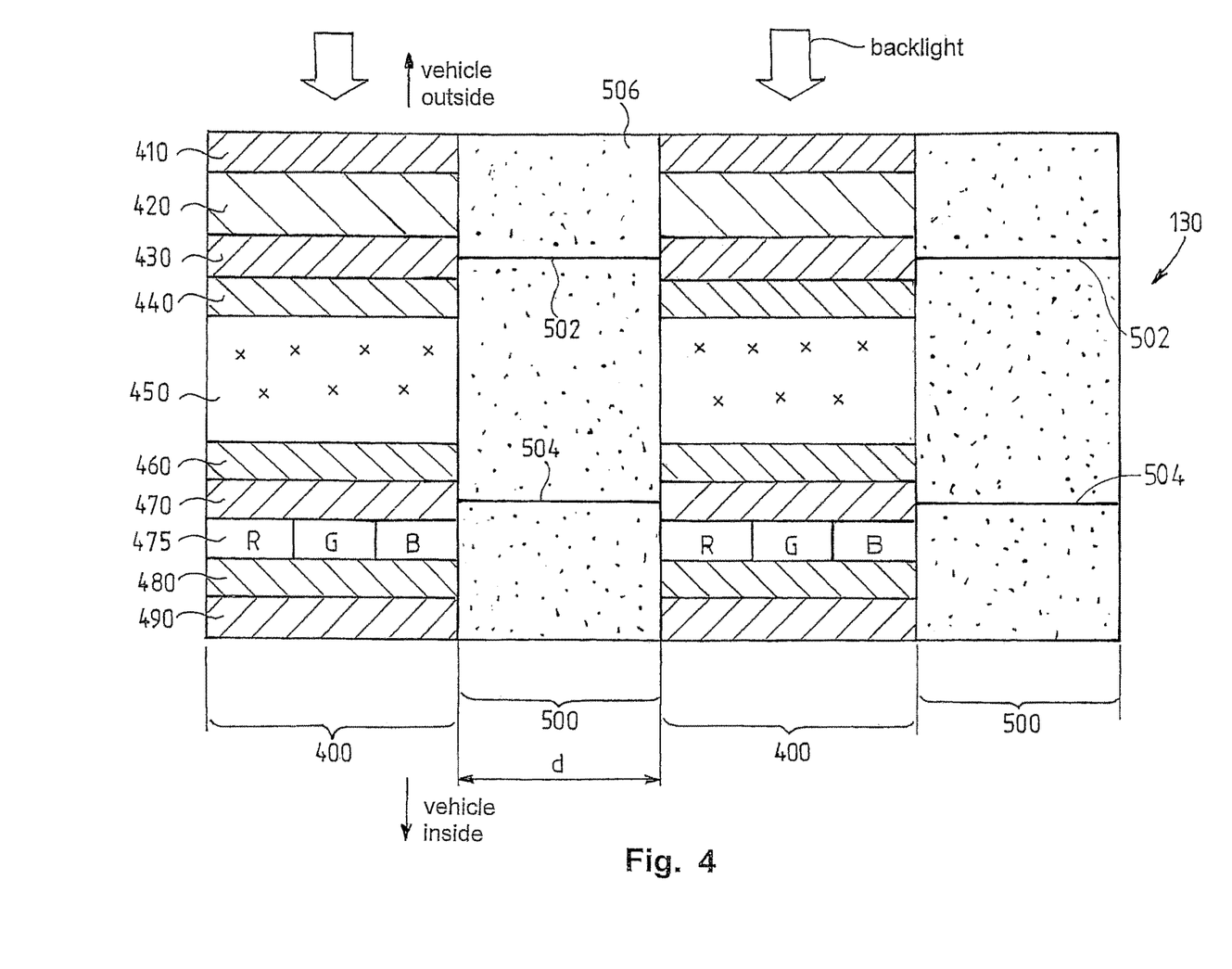
FIG. 4 illustrates, in a schematic cross-sectional view, another exemplary layer structure of the transparent display module for the windscreen display according to the present invention.

FIG. 4 illustrates another exemplary structure of the transparent display module 130 that may be used in the windscreen display according to the present invention. FIG. 4 schematically depicts the cross-section of a portion of the display module 130, taken either in the longitudinal or the transversal direction. In this structure, which is based on a conventional transparent LCD display structure, one pixel unit 400 is formed of the following layers specified in their order from outside inwards. The first, outermost layer of the pixel unit 400 is a polarizer layer 410, followed by a glass substrate 420. The next layer is a first electrode layer 430 which comprises transparent thin film transistors (TFTs) and electric conductors (signal lines) for controlling the voltage applied to the pixels. On the first electrode layer 430, there is an orientation film 440, followed by a liquid crystal layer 450. Then a second orientation film 460 and a second electrode layer 470 are arranged. The second electrode layer 470, which also comprises transparent thin film transistors (TFTs) and electric conductors (signal lines), is operated in cooperation with the first electrode layer 430 to control the voltage levels of the pixels. The next layer is a color filter layer 475 including red, green and blue color filter elements. The color filter layer 475 is followed by a further glass layer 480 and the innermost layer of the pixel unit 400 is a further polarizer layer 490.

The inter-pixel space 500 between the separate pixel units 400 is filled with transparent materials. The inter-pixel space 500 includes transparent conductor lines 502, 504 for establishing electrical interconnections between the first and second electrode layers 430 and 470, respectively, of the adjacent pixel units 400. Preferably, the inter-pixel space 500 further includes a transparent filling material 506 for providing color balance between the pixel units 400 and the inter-pixel space 500 so that the whole transparent display module 130 has the same color shade and the same refractive coefficient over its entire surface. The filling material 506 also functions to provide the display module 130 with a continuous and smooth outer surface on both faces thereof. Preferably, the optical properties of the filling material 506 used in the inter-pixel space 500 also match the optical properties of the pixel units 400. Additionally, the transparent filling material of the inter-pixel space 500 is also flexible.

The distance d between two adjacent pixel units 400 amounts to about 20-80% of the width of the pixel units 400 in both longitudinal and transversal directions of the display module 130, which allows bending the display module 130 in both directions at the same time without damaging the relatively rigid structures of the pixel units 400.

When using the above described LCD-type transparent display module for the windscreen display of the invention, the windscreen display 100 may utilize external background illumination, like sunshine or any other natural or artificial illumination source outside the vehicle. In this case, the windscreen display of the invention can operate with a relatively low power consumption, which is particularly beneficial when used in an electric vehicle. However, under week illumination conditions, e.g. at night use or in cloudy weather, the LCD-type windscreen display 100 may not receive enough external illumination, therefore it is preferably provided with a built-in light source arranged along the periphery of the display module 130 of the windscreen display 100. This built-in light source may be adapted to provide the required level of background illumination for the windscreen display module 130, in particular at night-time use. Due to the transparent materials of the windscreen display 100, the built-in light source may produce enough light intensity for the purpose of visual information presentation on the windscreen display 100 without disturbing the driver. It is noted that there is no need of built-in light source for a LED-type windscreen display as the LEDs themselves produce light.

Reverting to FIG. 2, on its inner side the windscreen display 100 further comprises a transparent protective layer 140 for providing a mechanical protection for the windscreen display 100. This protective layer 140 also functions as a water-proof cover for the inner side of the windscreen display 100. The protective layer 140 may also provide safety functions, for example it can prevent any undesired breaking properties of the windscreen of the vehicle. In one embodiment of the windscreen display 100, the protective layer 140 comprises a transparent adhesive film adapted for use on vehicle windscreens. Alternatively, the protective layer 140 may comprise a glass layer that is secured to the transparent display module 130 by means of a transparent gluing layer. The thickness of the protective layer 140 preferably ranges from about 0.1 mm to about 0.3 mm. When a glass layer is used in the protective layer 140, this glass layer is preferably made of a toughened glass, like Gorilla Glass™.

Figure 5:
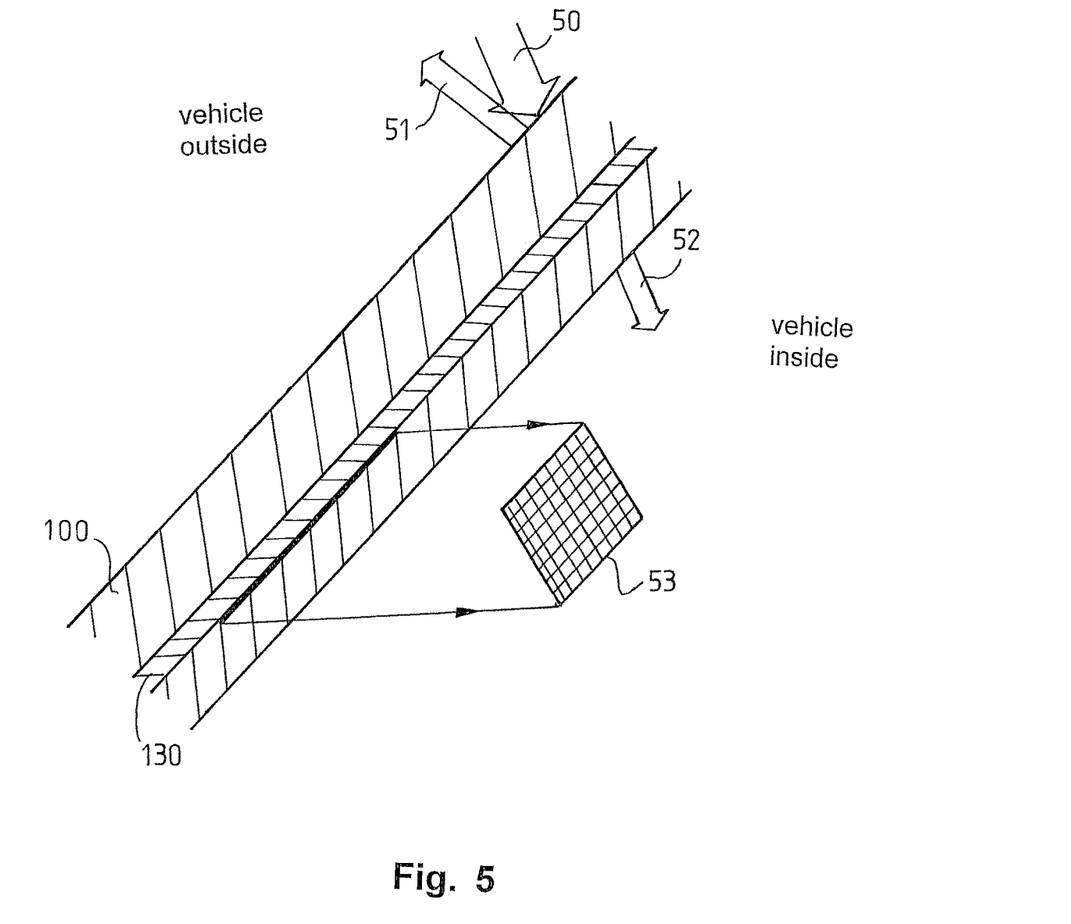
FIG. 5 schematically illustrates some optical features of the windscreen display according to the present invention.

FIG. 5 schematically illustrates the advantageous optical properties of the windscreen display 100 of the invention over the prior art windscreen HUDs (see FIG. 1). The integrated display module 130 of the windscreen display 100 produces an image 53 towards the driver. Since the image 53 is generated within the windscreen display 100, there is no additional refraction of the emitted light beams, therefore no spurious image can be seen on the windscreen of the vehicle. When the windscreen display 100 is of the LCD-type, a further advantage of the windscreen display 100 is that even if the incident light 50 has high intensity, only a minor portion of the incident light 30 can traverse the windscreen display 100 due to the darkening effect of the display module 130, thereby the inner side of the windscreen becomes less bright, which results in a much better contrast between the background and the presented image 53. As the darkness level of the display module 130 can be adjusted (automatically or manually), the transparency of the display module 130 can be increased at nightlight for producing a substantially constant level of background illumination for the windscreen display 100 under any external illumination condition.

In a specific embodiment of the windscreen display 100, one or more further layers may be added to the above mentioned layers of the windscreen display 100. For example, an additional UV-filter layer may be applied on the innermost protective layer 140 of the windscreen display 100. In another specific embodiment of the windscreen display 100, an optical layer comprising a lenticular lens system may be added to the windscreen display 100 behind the transparent display module 130 (i.e. between the transparent display module and the driver. Such an optical layer may allow three-dimensional presentation of the information on the windscreen display 100, or it may allow a divisional display mode, in which different images can be presented to the driver and the front passenger(s).

Figure 7:
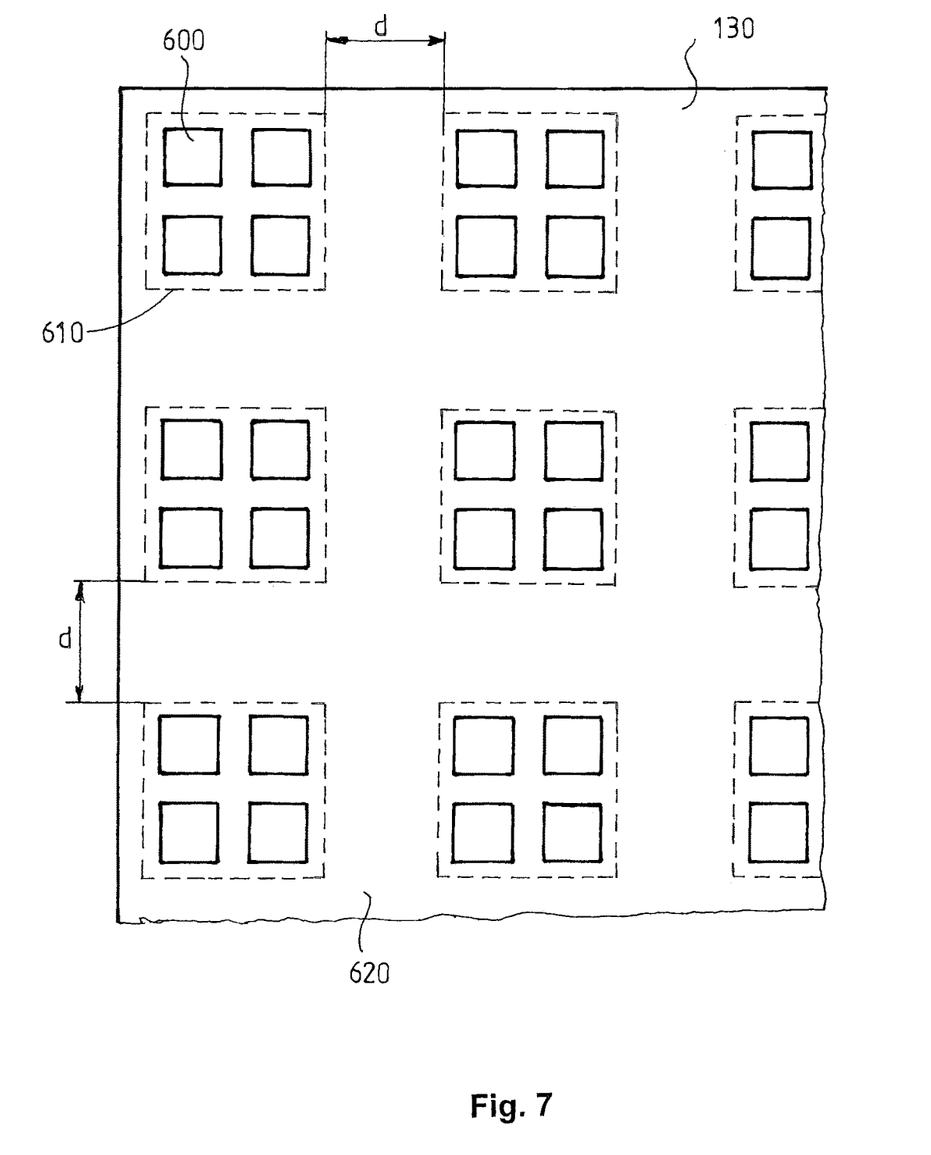
FIG. 7 is a schematic perspective view of another preferred embodiment of the present invention.

FIG. 7 is a schematic top plan view of another preferred embodiment of the present invention. In this embodiment, a specific number of pixel units 600, for example four or nine pixel units, together form a pixel array unit 610, and the inter-pixel space 620 is arranged between the adjacent pixel array units 610 in both longitudinal and transversal directions of the display module 130. The transparent filling material of the inter-pixel space 620 is flexible.

The distance d between two adjacent pixel array units 610 amounts to about 20-80% of the width of one pixel unit 600 in both longitudinal and transversal directions of the display module 130, which allows bending the display module 130 in both directions at the same time without damaging the relatively rigid structures of the pixel units 600. Since in this embodiment, the display module 130 contains a reduced area for bending with respect to the previous embodiments, the display module 130 is less flexible, but it still can be bent in both directions to the extent generally required for vehicle windscreens.

Operation of the Windscreen Module

The windscreen display of the present invention can be operated in substantially the same manner as the conventional transparent display devices. Some specific features of the windscreen display 100 according to the invention will be described below.

When using an LCD-type display module in the windscreen display of the invention, the windscreen may be divided into multiple zones with different transparency levels. This feature, however, can be used only when sufficient external background illumination is available, for example under daylight condition. The windscreen display may be operated so that a sharp transition of transparency be provided at the border of the adjacent zones, but it is also feasible that a gradual transition of transparency from a lighter zone to a darker zone is generated for the windscreen. The transparency of the various zones and the transition between the adjacent zones may be preset by the manufacturer, may be adjusted automatically in a programmed manner, with continuously adapting to the actual intensity of the external illumination, or may be manually adjusted by the driver (or the passenger) of the vehicle. Due to this feature, the use of a permanent coloring film on the windscreen may thus become unnecessary, which otherwise would have an adverse visual effect at driving in dark.

When using an external light source as the background illumination for the LCD-type windscreen display, it is also possible to adjust the transparency of the windscreen display, either partly or as a whole, by controlling the light intensity of the pixels of the portion of the windscreen which is subject to the changing the transparency. For example, when the windscreen should be darkened because of strong sunshine, the intensity of the (translucent) pixels of a part of the windscreen or even those of the entire windscreen could be decreased by reducing the activation level of the respective pixels of the windscreen display module.

Due to the elimination of the spurious images and the possibility of using the entire surface of the windscreen as a display area, more sophisticated visual effects can be presented on the windscreen display according to the invention. For example, graphical animations may be presented and these animations may even be combined with augmented reality or mixed reality functions for an enhanced visualization. In this context, for example, the view of the displayed graphical elements or animations may be changed as a function of the position and orientation of the driver's head.

In case the windscreen display is equipped with a lenticular lens system, preferably as an innermost layer of the windscreen display, as mentioned above, the information can be displayed in three-dimensional presentation, or the windscreen display could be operated in a divisional display mode, in which different images can be presented to the driver and the front passenger(s). To this end, the graphical processing of the content to be visually presented can be carried out in the control unit by means of appropriate hardware and/or software tools. For example, using such a lenticular lens system with the windscreen display according to the present invention, the images of certain dashboard instruments can be shown at a virtual distance from the user where the driver's eyes are focusing during driving, thereby the reaction time can be decreased and the comfort feeling of the driver can also be improved.

When using the LCD-type windscreen display of the present invention, the graphical presentation of the information takes place in a reverse mode with respect to the conventional transparent displays. This means that instead of actively showing (brightening) the information or the graphical objects on the windscreen by means of a rear light source of the display, the content to be visualized is rather produced by appropriately reducing transparency of the windscreen display according to the shapes of the information elements or the graphical objects, i.e. the content is visualized by darkening. This darkening effect is achieved by respectively activating the color filter elements of the LCD-type display module. The higher the activation level of a color filter element is, the more light is allowed to pass through it, which results in a brighter pixel. The activation level of the individual color filter elements can be adjusted in the desired way to control transparency and, at the same time, the brightness of the pixels of the display module 130. The various activation levels of the different color filter elements of a given pixel unit produce a specific color with a specific brightness for the pixel unit.

The signal lines of the windscreen display, which are led out of the windscreen to a terminal or a connector, or bundled into wires, are driven by a control unit including a multiplexer which is controlled by a processor. The processor may be coupled to a central on-board computer of the vehicle which can provide the control unit of the windscreen display with various pieces of information for presentation. The hardware and software components the control unit of the display module, as well as the operation of the control unit is well known for those skilled in the art and therefore their further description is omitted.

A preferred method of manufacturing the windscreen display of the present invention will be described below.

In the first step of manufacturing, the transparent display module 130 is produced according to any one of the above described layer structure. The production technologies of the transparent LCD-type displays and the transparent LED-type displays, like the OLED displays, are well known for those skilled in the art. The production of the transparent display module used in the windscreen display of the present invention differs from the conventional production technologies only in that the pixel units are formed to be at a specific distance from each other in both direction of the display, and the inter-pixel volume of the display module is filled with one or more transparent materials. The inter-pixel volume always involves the electrical connections (i.e. signal lines) in a single layer (for LED-type display modules) or in two separated layers with an electrically insulating layer therebetween (for LCD-type display modules). The material of the electrical connections may be the same as the material of the electrical connections used in the electronic control layer 220 or the electrode layers 430, 470. These materials may include, for example, Indium Tin Oxide, which is a transparent glass-like material typically used for the electrodes of the transparent displays.

The other transparent filling materials of the inter-pixel space, like coloring materials, are selected so that they are compatible with the each other and the materials used in the pixel units. In a preferred embodiment of the windscreen display, the inter-pixel volume of the display module forms a part of an additional coloring layer, which covers the entire area of the display module over the whole windscreen display. The materials of the entire windscreen display are selected so that the windscreen display, as a whole, behaves like a homogenous material both in optical and mechanical terms.

Once the display module has been produced, the various layers of the windscreen display are placed one above the other in the above specified order. After the one or more adhesive layers reached its desired bonding effect and thereby a planar structure is achieved, the whole windscreen display is formed to have a specific three-dimensional shape. This shaping step is preferably carried out by high-pressure plastic forming of the planar structure of attached layers wherein the planar structure is bent along two directions. As mentioned above, bending of the windscreen display of the invention along two directions is allowed by the reduced pixel resolution of the display module used in the windscreen display. The bending steps may be carried out simultaneously or subsequently depending on the available pressing tool and the mechanical stress tolerance properties of the multilayer structure of the windscreen display. Preferably, the high-pressure plastic forming along the various directions is carried out in a single step by using a pressing tool of the desired three-dimensional shape and applying a pressure of at least about 1 kPa over the entire surface of a flat multilayer windscreen display structure to achieve the final three-dimensional shape thereof. Alternatively, the various layers of the windscreen display structure may be produced in a shaped form separately and then the individual layers, which have been bent along two directions, may be fixed to each other by any known technique, like heat pressing, gluing, etc.

Figure 6:
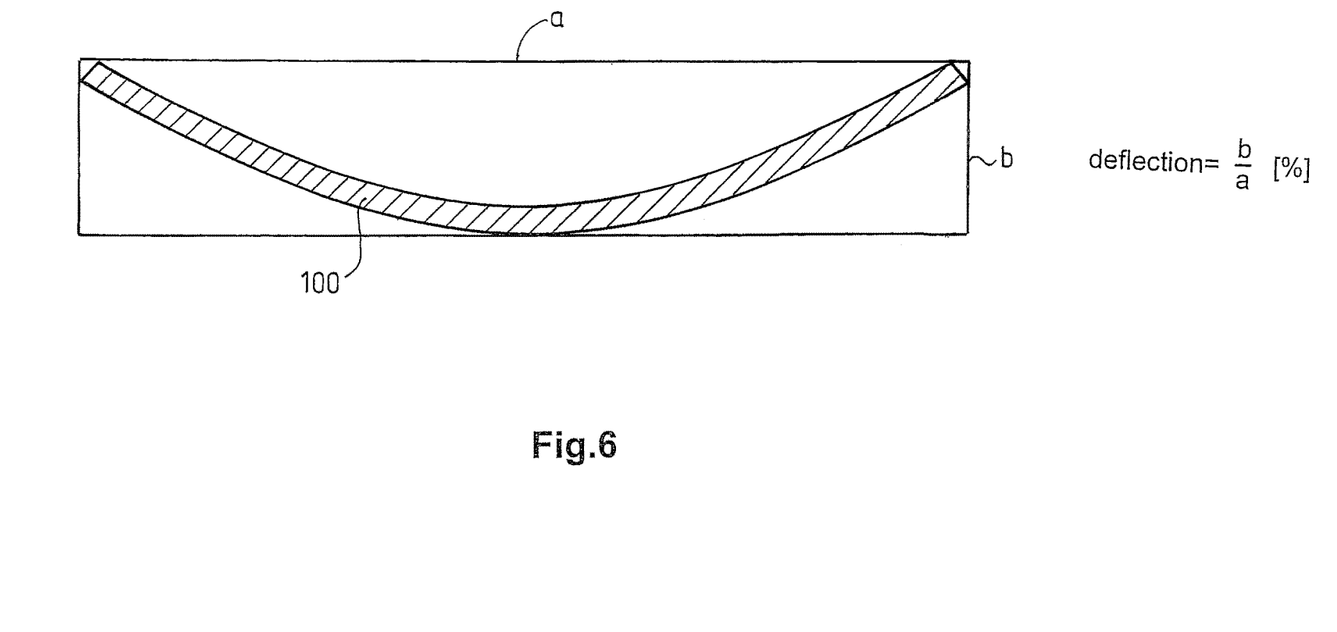
FIG. 6 illustrates the deflection geometry of the windscreen display according to the present invention.

When shaping the windscreen display of the present invention, at least a part of the windscreen display is bent along two directions with a minimum deflection of 5% in a first direction (which is typically the vertical direction) and a minimum deflection of 10% in a second direction (which is typically the horizontal direction). Within the context of the present invention, the term "deflection" is used for the aspect ratio of a rectangle which encompasses the cross-section of the final shaped windscreen display 100 along a specific direction as illustrated in FIG. 6. The deflection is herein defined as the ratio of the shorter edge to longer edge of the above mentioned encompassing rectangular. For example, the windscreen display of the present invention can be bent with a deflection of about 10-15% along the horizontal direction as a first direction, and with a deflection of about 5-7% along a second direction perpendicular to said horizontal first direction. The surface regions of the windscreen display to be subject to shaping are selected depending on the intended use of the windscreen display. For example, for cars of compact size, greater deflections may be needed in all bending directions, whereas for trucks, smaller deflections may be enough.

Alternatively, other shaping techniques, which are suitable for bending the planar multilayer structure of the windscreen display of the present invention along two directions, may also be applied. These shaping techniques are well known for those skilled in the art of glass-making and therefore not specified here in detail. The windscreen display according to the present invention has, among others, the following advantages with respect to the prior art transparent display solutions:

1. The reduced pixel resolution of the display module allows a significantly higher transparency than that of the commercially available transparent displays, therefore making the display module suitable for use in the windscreens of vehicles.
2. The reduced pixel resolution of the display module and the inter-pixel regions provide a higher flexibility for the display module in comparison with the conventional transparent displays, and allow bending of the display module along two orthogonal directions. This feature makes the display module suitable for use in the windscreen of vehicles as these windscreens are typically shaped to have spherical or 3D arcuate surface portions.
3. The reduced pixel resolution of the display module allows a significantly lower power consumption of the electronic components used therein, which is particularly beneficial for use in electric vehicles.
4. The reduced pixel resolution of the display module also reduces the production costs of the display module, and thereby makes the windscreen display less expensive.
5. When using an external light source for the background illumination, the LCD-type windscreen display is capable of adjusting its transparency by controlling the activation levels of the color filter elements of the pixel units. However, when the intensity of the external light source is too low (for example, at night), the built-in illumination light source of the display module can be used to produce the required level of brightness of the displayed objects.

The invention claimed is:

1. A transparent windscreen display (100) having a multilayer structure comprising at least the following layers:
   a transparent substrate layer (110);
   a transparent adhesive layer (120);
   a transparent display module (130); and
   a transparent protective layer (140);
   wherein the display module (130) is configured to have a plurality of pixel units (200, 400) or pixel array units (610) with an inter-pixel space (260, 500, 620) therebetween, wherein there is a predetermined distance (d)

between the adjacent pixel units (200, 400) or pixel array units (610) in both longitudinal and transversal directions of the display module (130), said distance (d) being about 20-80% of the width of one pixel unit (200, 400, 600), and wherein said inter-pixel space (260, 500, 620) is filled with a transparent material and involves flexible electric conductors (225, 502, 504) for electrically connecting the adjacent pixel units or pixel array units, and wherein at least a part of the transparent display module (130) of the windscreen display (100) is bent along two directions with a minimum deflection of 10% in a first direction and a minimum deflection of 5% in a second direction perpendicular to said first direction, and wherein said transparent display module (130) is formed as an LCD display panel without a backside illumination unit.

2. The windscreen display of claim 1, wherein the material of the transparent substrate layer (110) is selected from the group of glass and transparent polymer.

3. The windscreen display of claim 1, wherein the protective layer (140) comprises a single layer of a transparent adhesive film, said adhesive film being secured to the transparent display module.

4. The windscreen display of claim 1, wherein the protective layer (140) comprises a transparent gluing layer and a glass layer, said glass layer being secured to the transparent display module via said gluing layer.

5. The windscreen display of claim 1, further comprising a built-in light source arranged along the periphery of the transparent display module (130).

6. The windscreen display of claim 1, wherein the predetermined distance (d) between the adjacent pixel units (200, 400) or pixel array units (610) in both longitudinal and transversal directions of the display module (130), and the width of the pixel units (200, 400, 600), result in a transparency of about 60% or higher for the transparent display module 130.

7. The windscreen display of claim 1, wherein the distance between the adjacent pixel units ranges from 0.2 mm to 0.6 mm.

* * * * *